(12) United States Patent
Szelong et al.

(10) Patent No.: US 7,586,745 B1
(45) Date of Patent: Sep. 8, 2009

(54) UNIQUE AIRFLOW PATH USING FUNGIBLE CHASSIS COMPONENTS

(75) Inventors: Michael Szelong, Sunnyvale, CA (US); Keith Son, Sunnyvale, CA (US)

(73) Assignee: Network Appliance, Inc., Sunnyvale, CA (US)

( * ) Notice: Subject to any disclaimer, the term of this patent is extended or adjusted under 35 U.S.C. 154(b) by 0 days.

(21) Appl. No.: 11/506,114

(22) Filed: Aug. 17, 2006

Related U.S. Application Data (60) Provisional application No. 60/778,114, filed on Mar. 1, 2006.

(51) Int. Cl.
*H05K 7/20* (2006.01)
(52) U.S. Cl. ............... 361/695; 361/690; 361/694; 454/184
(58) Field of Classification Search ............ 361/687, 361/694–695; 454/184
See application file for complete search history.

(56) References Cited

U.S. PATENT DOCUMENTS

| | | | | |
|---|---|---|---|---|
| 5,663,868 A | * | 9/1997 | Stalley | 361/695 |
| 5,912,801 A | * | 6/1999 | Roy et al. | 361/690 |
| 6,574,100 B1 | * | 6/2003 | Anderson | 361/687 |
| 6,904,968 B2 | * | 6/2005 | Beitelmal et al. | 165/247 |
| 6,906,918 B2 | * | 6/2005 | Rabinovitz | 361/687 |
| 7,182,208 B2 | * | 2/2007 | Tachibana | 211/26 |
| 7,227,751 B2 | * | 6/2007 | Robbins et al. | 361/695 |

* cited by examiner

*Primary Examiner*—Gregory D Thompson
(74) *Attorney, Agent, or Firm*—Suiter Swantz pc llo (57) ABSTRACT

A chassis assembly for an electronic device such as a storage device. The assembly includes a chassis for housing various functional components included in the electronic device. A sub-housing for containing a waste heat generating device, a device which requires temperature moderation, is included. The sub-housing defines a first airflow exhaust path for exhausting air in a first direction and a second airflow exhaust path for exhausting air in a second direction. The directing of airflow from the sub-housing is based on a chassis enclosure configuration such as to allow for the implementation of a common component including a component enclosure in a variety of chassis form factors. A method of controlling airflow in a electronic device enclosure includes the steps of utilizing a fan to generate a flow of air, directing the flow of air through a sub-housing including a waste heat generating device, and implementing the electronic device enclosure to selectively direct the exhaust path of the generated airflow from the sub-housing base on the configuration of the electronic device enclosure.

33 Claims, 7 Drawing Sheets

UNIQUE AIRFLOW PATH USING FUNGIBLE CHASSIS COMPONENTS

CROSS REFERENCE TO RELATED APPLICATIONS

The present application claims the benefit of U.S. Provisional Application Ser. No. 60/778,114 filed Mar. 1, 2006. Said U.S. Provisional Application Ser. No. 60/778,114 filed Mar. 1, 2006 is hereby incorporated by reference in its entirety.

FIELD OF THE INVENTION

The present invention relates to the field of information handling system hardware and particularly to a chassis assembly for utilization with modular components and differing enclosure form factors while promoting cooling for waste heat generating components.

BACKGROUND OF THE INVENTION

Consumer demand for data storage systems and information handling systems is problematic as user requirements vary based on technical specifications and meeting user demand for a desired hardware component configuration. Manufactures often provide hardware having differing form factors to meet user demands, allow for maximized utility, while attempting to simplify manufacturing logistics. Often manufacturers are required to produce multiple systems configurations which have similar functional characteristics, but have differing physical attributes to meet user demands. For instance, a manufacturer may be required to provide substantially the same functionality for data storage device configured as a rack system, a desktop enclosure, and a small or entry level enterprise enclosure. While each particular system meets consumer demand, these systems do not allow for efficient component interchangeability. As a result, functional components may be limited to a particular enclosure form factor. While complicating manufacturing logistics and requiring additional resources, the differing form factors of functional components and enclosures may require additional redundant components be maintained by information technology (IT) departments, raise complications for field repair of the system and increase the difficulty of obtaining replacement components. Manufacturers, suppliers, and service entities may additionally have to maintain component reserves to accommodate their customer's needs and ensure minimized down time for the expected life of the systems.

While manufacturers may attempt to standardize functional components between different system configurations, the interoperability of the functional components within the physical system is problematic. For instance, while a combination of a motherboard module, battery module, power supply module, and data storage module may operate within parameters when configured in a rack system, the same configuration may be unacceptable for a desktop type enclosure due to operational parameters.

Besides providing an enclosure which permits physical incorporation, electrical and communicative coupling, many of the functional components require proper cooling to guarantee proper operation, increase life expectancy, and reduce the likelihood of downtime. Cooling data storage systems and information handling systems require proper airflow over waste heat generating components. Heat sinks included in functional components also require sufficient heat dissipation as well. Appropriate cooling is difficult as waste heat typically is not uniformly generated within the component itself. Components such as modules containing processor units or power supplies may also require more cooling capacity than a data storage device. Some functional components such as batteries may be particularly sensitive to temperature fluctuations. For example, the longevity of the non volatile random access memory (NVRAM) battery, for supplying power to back up system memory may be impacted by temperature variations and high temperature conditions. Further, as the functional components may be arranged in different configurations within diverse enclosures, the overall airflow within the enclosure should provide sufficient cooling based on the cooling demands of the components to allow for interoperability of a component configuration within the variety of enclosure form factors.

Therefore, it would be desirable to provide a chassis assembly and method for providing efficient component cooling over a variety of electronic device enclosure form factors while permitting modularity of components.

SUMMARY OF THE INVENTION

Accordingly, the present invention is directed to an apparatus and method for providing modular component interchangeability while promoting sufficient component cooling.

In an aspect of the present invention, a chassis assembly for an electronic device such as a storage device is described. The assembly includes a chassis for housing various functional components included in the electronic device. At least one sub-housing for containing a waste heat generating device, a device which requires temperature moderation, is included. The size and configuration of the sub-housing permitting inclusion in a variety of different chassis configurations. The at least one sub-housing defines a first airflow exhaust path for exhausting air in a first direction and a second airflow exhaust path for exhausting air in a second direction. The directing of airflow from the sub-housing is based on a chassis enclosure configuration such as to allow for the implementation of a common component including a component enclosure in a variety of chassis form factors.

In a further embodiment, a method of controlling airflow in an electronic device enclosure includes the steps of utilizing a fan to generate a flow of air, directing or drawing the flow of air through a sub-housing including a waste heat generating device, and implementing the electronic device enclosure to selectively direct the exhaust path of the generated airflow from the sub-housing base on the configuration of the electronic device enclosure.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings. The principles of the present invention may be utilized in a variety of electronic devices including data storage devices, information handling systems and the like devices which implement modular sub-components. It is the intention of the present disclosure to encompass and include such variation.

Figure 1:
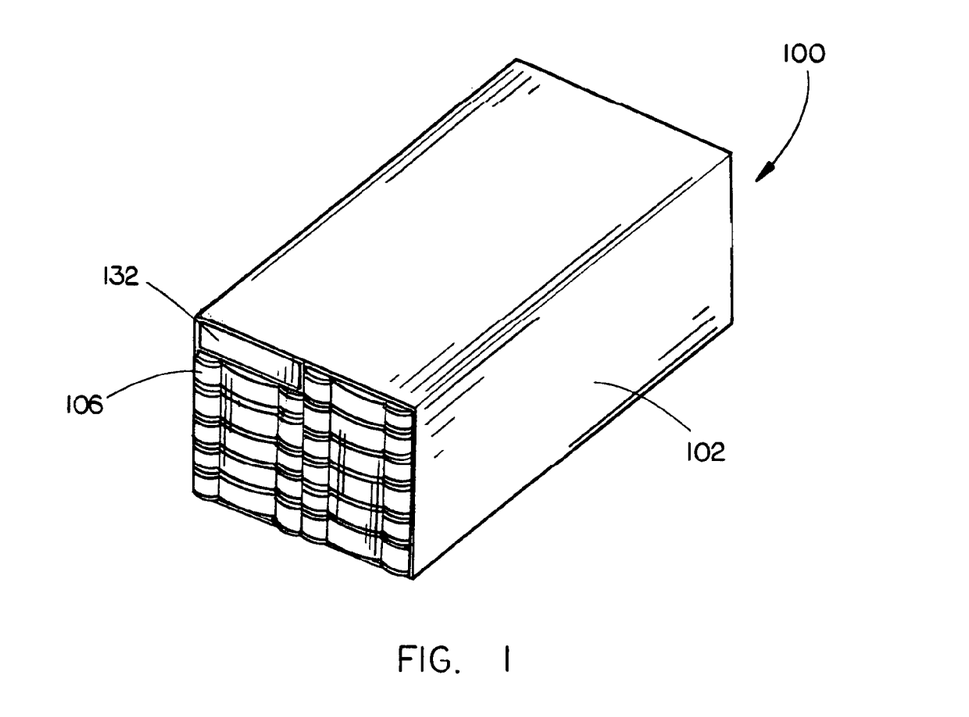
FIG. 1 is an isometric view of a desktop data storage device chassis assembly in accordance with the present invention.

Referring to FIG. 1, in the present embodiment, a chassis assembly 100 is discussed. In the present embodiment, a chassis 102 included in the assembly 100 has a desktop form factor or physical configuration. Other suitable chassis configurations include a rack form factor (as may be generally observed in FIG. 3), a desk side form factor, or the like. Those of skill in the art will appreciate the configuration of the chassis or primary enclosure for the electronic device may vary without departing from the scope and spirit of the present invention. For example, a chassis assembly in accordance with the present invention may have a depth (front-to-back, as generally observed as arranged in FIG. 1) of between 16"-18" (sixteen to eighteen inches) while a current chassis is between 24"-26" (twenty-four to twenty-six inches). The foregoing shorter depth, in comparison to current chassis systems, may be achieved through the utilization of a non-linear flow path through the chassis 102.

In other embodiments, the chassis may include an expansion chassis or secondary chassis attached to the primary or main chassis. Secondary chassis may be physically connected to and provide communicative coupling to the primary chassis to expand the functional capability of the system by permitting the addition of data drives or the like. Physical connection of an auxiliary chassis may be accomplished through the utilization of interconnecting mechanical structures, fasteners such as screws, and the like for integrating the expansion enclosure to the main chassis. The secondary chassis may include similar parameters as described in connection with a main chassis. In a further example, two secondary chassis are configured in a side by side arrangement to permit utilization in an industry standardized rack system in addition to a stacked and standalone configurations.

Figure 2:
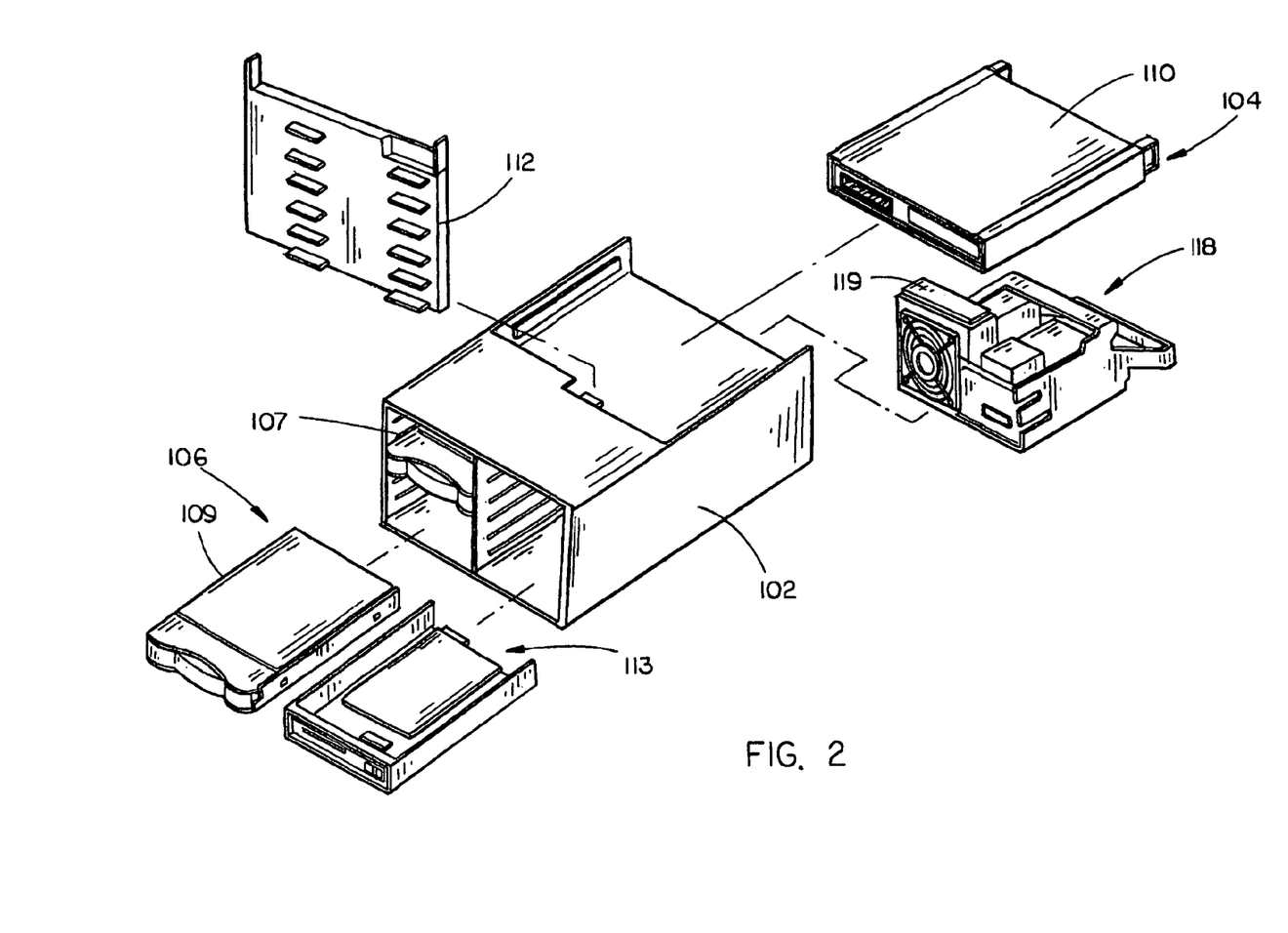
FIG. 2 is an exploded view of a desktop data storage device chassis assembly in accordance with the present invention.

Referring to FIGS. 1 and 2, in the present embodiment, the chassis 102 is configured to allow a processor module 104 to extend substantially the entire width of the chassis 102 (with the width being the dimension extending substantially from right to left when observed as illustrated in FIG. 1). In further embodiments, a second chassis form factor is generally twice the width of the desktop form factor. Dimensioning the component sub-housing in this manner may permit for modular utilization between chassis form factor types. For example, a modular component is capable of being implemented in either an industry standard 19" (nineteen inch) wide rack or a tower form factor. Additionally, modular components, i.e., the component sub-housings, of the present invention may be dimensioned to fit within an industry standard rack (width). For example, component is configured to be positioned in a side-by-side configuration in a 19" (nineteen inch) wide industry standard rack system while being dimensioned to fit within a tower configuration. The processor module 104 may be a central processor unit (CPU) having a motherboard for controlling the operation of the electronic device such as a data storage system. The electronic device may be an information handling system, such as a server, or the like electronic device utilizing modular components. The chassis assembly of the present invention may promote efficient manufacturing by minimizing the number of component physical configurations for the variety of chassis form factors offered. The chassis 100 defines a chassis enclosure configuration defining a variety of parameters. Exemplary chassis enclosure configuration parameters include the configuration of the exterior walls or partial walls of the chassis, internal walls or partitions included in the chassis (such as in a rack form factor chassis), the configuration and arrangement of structures for holding received functional components, the configuration and arrangement of electrical connectors, communication connectors, and the like. Structures for holding received components include rails, grooves, lock-down fasteners for holding functional components, and the like. For example, the chassis 102 includes opposing slots formed on two generally opposite wall of the enclosure for holding the midplane 112 in place. The rails/slots may be formed as separate structures which are secured to the chassis fame or a panel forming the field of the chassis wall. The midplane 112 may be additionally secured via friction locks, screws or the like. In a further example, the chassis includes corresponding rails 107 or grooves extending toward/away from the midplane 112 to an opening in the chassis 102 to allow for engagement of corresponding connectors on a second component with connectors on the midplane.

Exemplary functional components include processing units, motherboard modules, data storage drives, removable media drives, power supplies 118, battery modules 113, electrical/signal connectors (such as a midplane for electrically/signal connection between components), and the like. Functional components may be housed in a component enclosure, or sub-housing, for at least partially encompassing the device. Those of skill in the art will appreciate a sub-housing may include a bezel cover for at least partially providing an integrated enclosure wall of the electronic device chassis. For example, a portion of the sub-housing bezel cover may form a portion of the bezel cover for the exterior chassis wall. The sub-housing may include openings for insertion of media, connecting electrical/signal connection, exposing displays, e.g., a liquid crystal display (LCD), or the like. For instance, a data storage device such as a hard drive may be contained within a drive carrier 106 or enclosure for containing the drive. The drive carrier 106 may have corresponding rails 107 or grooves for engaging with the chassis 102 rails 107 or grooves. Sub-housings may be secured via a frictional lock, mechanically interlocking structures, fasteners (e.g., screws), or the like.

Referring to FIG. 2, in the present embodiment, a processor module enclosure 110 is approximately twice the width of a data storage drive carrier 106, i.e., generally right to left when viewed as observed with respect to the orientation shown in FIG. 1. The foregoing approximation may allow for a center divider 109 to be disposed between two drive carriers arranged in a side by side fashion (as may be observed in FIG. 3), allow for airflow exhaust from a processor module enclosure to flow between the processor module enclosure 110 and the walls forming the chassis 102, permit the inclusion of mounting rails, or the like. Furthermore, the dimensions of the component enclosure may be optimized to allow for interconnection with the variety of contemplated chassis form factors such as to form a family of chassis which all implement common functional components. In the example, shown in FIGS. 1 and 2, the processor module 104 may be disposed on a first side of the midplane 112 while data drives are disposed on an opposite side of the midplane 112 in a desktop form factor chassis. In further embodiments, the midplane is arranged and configured for connection of additional components from substantially one side, or one direction, such as when a rack form factor is implemented. The chassis enclosure configuration may be designed to implement functional components to direct airflow within the chassis. For instance, a sub-housing or enclosure for a processor module is configured to block or direct airflow from second component to allow for efficient cooling of the functional components within a data storage system. In the forgoing example, the chassis enclosure configuration arrangement of components within the chassis is designed to direct airflow within the chassis and the sub-housings included in the chassis. For example, prior to cooling a processor module, an airflow is directed over the NVRAM battery to minimize battery heating due to waste heat generated by other functional components included in the electronic device. This may advantageously prevent failure of the battery as batteries may be particularly sensitive to temperature variation and high temperature.

Referring to FIGS. 4A through 5B, in an embodiment, a sub-housing 114 or component enclosure is constructed to direct a flow of air (generally illustrated by arrow 116) through the sub-housing 114 over a waste heat generating device, or a device requiring cooling, contained within the sub-housing. For instance, a motherboard module enclosure is configured to direct airflow over the processor and chipset to promote cooling. Airflow also may be directed over heat sinks utilized for absorbing waste heat generated by a heat generating component. Other functional components requiring cooling from waste heat include power supplies, batteries, data storage drives, media drives and the like devices requiring cooling. An airflow may be externally generated, in relation to the sub-housing containing the component, while remaining substantially within the chassis 102. In an embodiment, the cooling fan is contained within the chassis to permit utilization of larger impeller blades (in comparison to a fan disposed on an enclosure wall) and to dispose the fan in the interior of the chassis rather than adjacent the perimeter of the chassis enclosure. For example, a current enclosure implementing a 80 mm (eighty millimeter) fan, disposed on the periphery may revolve at between 2000 RPM through 3500 RPM (revolutions per minute) while the present in-board configuration allows for a 120 mm fan to operate at approximately 2000 RPM thereby reducing cyclical noise while moving an equivalent or greater amount of air than the 80 mm fan operating at higher RPMs. Airflow may be drawn into the chassis 102 through a portion 132 (generally observed in FIGS. 1 and 2) of the chassis configured for this purpose. Disposing the fan inboard the chassis may reduce the noise and vibration experienced external to the chassis. For example, a fan having larger impeller blades, in comparison to current devices which implement smaller dimensioned fans mounted to an outer portion of the chassis. Utilization of a fan having proportionally larger blades allows for reduced revolutions per minute (RPM) over a fan having smaller blades while moving an equivalent or greater amount of air. For example, fans may be aligned in an inline fashion such that if one fan fails the additional fan is sufficient to cool the components. These fans may be placed either within the chassis and/or within power supplies. The power supplies may be configured to allow for hot swapping or may allow for redundancy without the additional expense and design required to permit hot swapping. For example, two non hot swap compliant power supplies are included. In the foregoing manner, if one power supply fails the additional power supply is implemented to provide power and cooling (via an included fan or fans). In addition, in the current configuration of component/chassis/fan the airflow path is reduced thereby allowing for a more compact chassis configuration and shortened front-to-back airflow path (as generally observed in FIG. 1) over currently existing systems. An inboard fan may minimize the manufacturing complexity as mounting a fan to the chassis with screws may be eliminated in favor of a fan which is secured via a common mounting rail/groove scheme. The fan may be positioned upstream or downstream from the component for which cooling is desired. The fan 119 may be integrated into a power supply 118 component with the enclosure walls of the chassis and functional components directing the airflow over the power supply electrical unit and towards a second functional component included in the chassis. This configuration may allow airflow through the component sub-housings requiring cooling or temperature moderation.

Figure 5A:
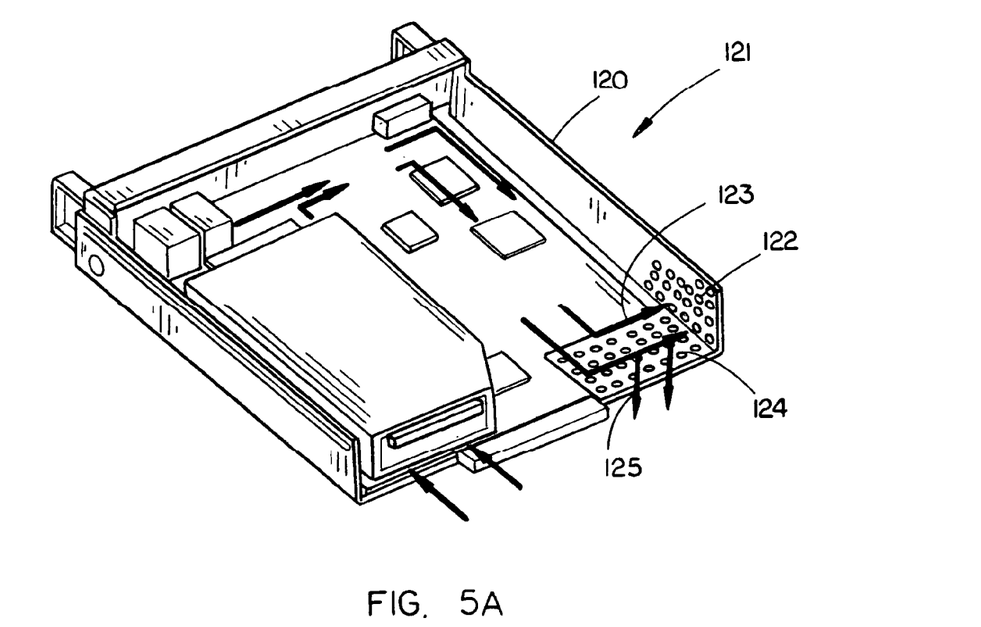
FIG. 5A is an isometric view of a component sub-housing including representations of various airflow through the sub-housing.
Figure 5B:
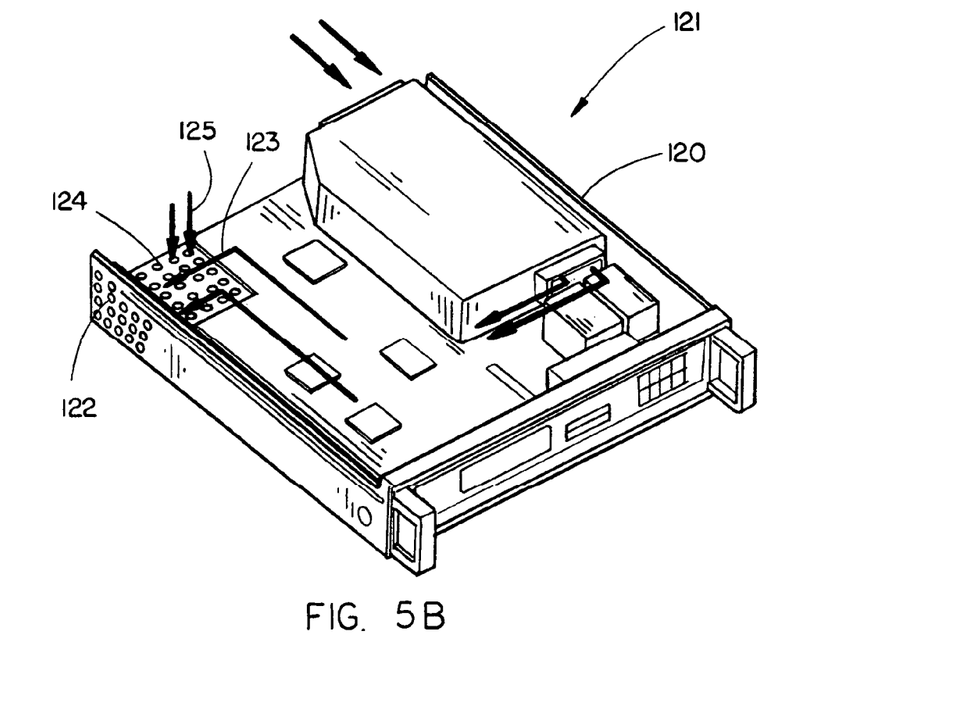
FIG. 5B is an obverse view of the component sub-housing of FIG. 5A.

Referring to FIGS. 5A and 5B, a sub-housing 120 in accordance with an embodiment is disclosed. While a motherboard module 121 is described, those of skill in the art will appreciate that a wide variety of functional components may benefit from the principles of the present invention thus, promoting interoperability/interchangeability of components across a wide variety of chassis configurations and form factors. Other exemplary functional components include data storage drives, removable media drives, power supplies, battery modules, electrical/signal connectors, and the like. The sub-housing configuration may be varied based on the cooling needs of devices included in the functional component. For instance, in the motherboard module, an airflow is directed over the processing chip, chipset, memory, over heat sinks, and the like components having waste heat, included in the motherboard. In other modules, airflow may be directed over power supply components, batteries, hard drives, removable media component devices, and the like. The airflow may sequentially pass over contained component devices or be split so a portion of the airflow is directed over a first device, while a second portion of the airflow is passed over a second device. Airflow within the component sub-housing may be directed by the walls or wall portions of the chassis itself, partition walls, portions of the functional components, and the like. Utilizing the sub-chassis/chassis of the present invention the overall dimensions of the sub-housing/chassis are reduced in comparison to a linear airflow configuration. The component sub-housing may be formed of variety of rigid/substantially rigid materials or combinations of materials including rigid plastic, formed sheet metal, and the like based on aesthetics, electromagnetic shielding and static charge dissipation properties, waste heat management, component protection, manufacturing considerations, and the like.

With reference to FIGS. 5A and 5B, the sub-housing is constructed to define a first airflow exhaust path 122 and a second airflow exhaust path 124. It is to be appreciated that additional exhaust paths may be included based on component parameters, parameters associated with the overall electronic device, parameters associated with a family of devices offered by a manufacturer (such as the variety of chassis form factors), the chassis enclosure configuration, and the like cooling requirements. The exhaust paths may be defined by a plurality of apertures, louvers, interior partition walls, or the like. Utilizing a sub-housing of the present invention may reduce the depth of the component (i.e., the dimension extending towards/away from a bezel cover over current component enclosures as the airflow is directed in a non-linear path. For instance, in a component, including the component sub-housing is configured to have a "L-shaped" airflow or a "U-shaped" airflow. Advantageously, a more compact packaging form factor may be enabled by using an airflow design that employs L or U shaped turns and other directional changes thereby shortening the depth of the package. This will enable the design to be used in areas where space is limited.

In the present embodiment, the first airflow path 122 is configured to direct airflow in a first orthogonal direction, while the second airflow path 124 is configured to direct airflow is a second orthogonal direction. For instance, the first airflow path 122 is configured to direct air in a first direction 123, while the second airflow path 124 is configured to direct airflow in a second direction 125 which is perpendicular to the first direction. In other examples, a first airflow path and a second airflow path are directed at different locations along a single wall included in the component enclosure. The direction of the airflow from the component sub-housing may be selectively blocked, directed, or the like based on the enclosure configuration of the chassis.

Figure 4A:
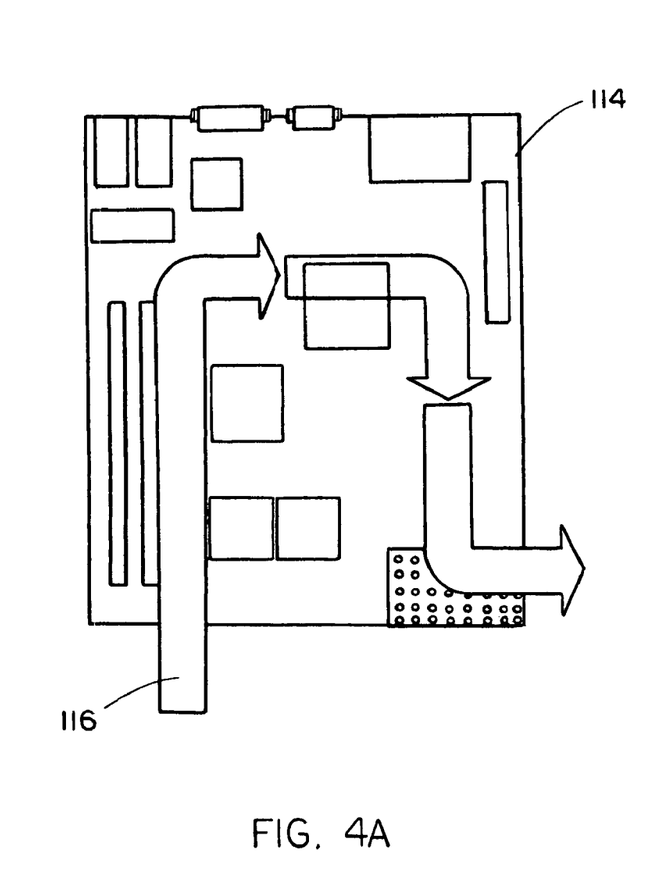
FIG. 4A is a top plan view of a component sub-housing including representation of an airflow through the sub-housing being directed in a first direction.
Figure 4B:
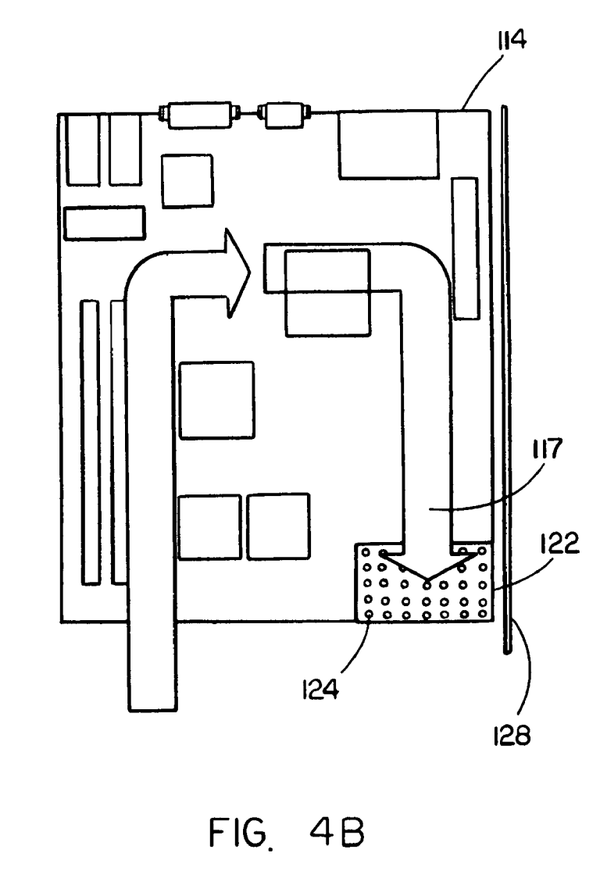
FIG. 4B is a top plan view of a component sub-housing including representation of an airflow through the sub-housing being directed in a second direction based on the presence of an enclosure wall.
Figure 6:
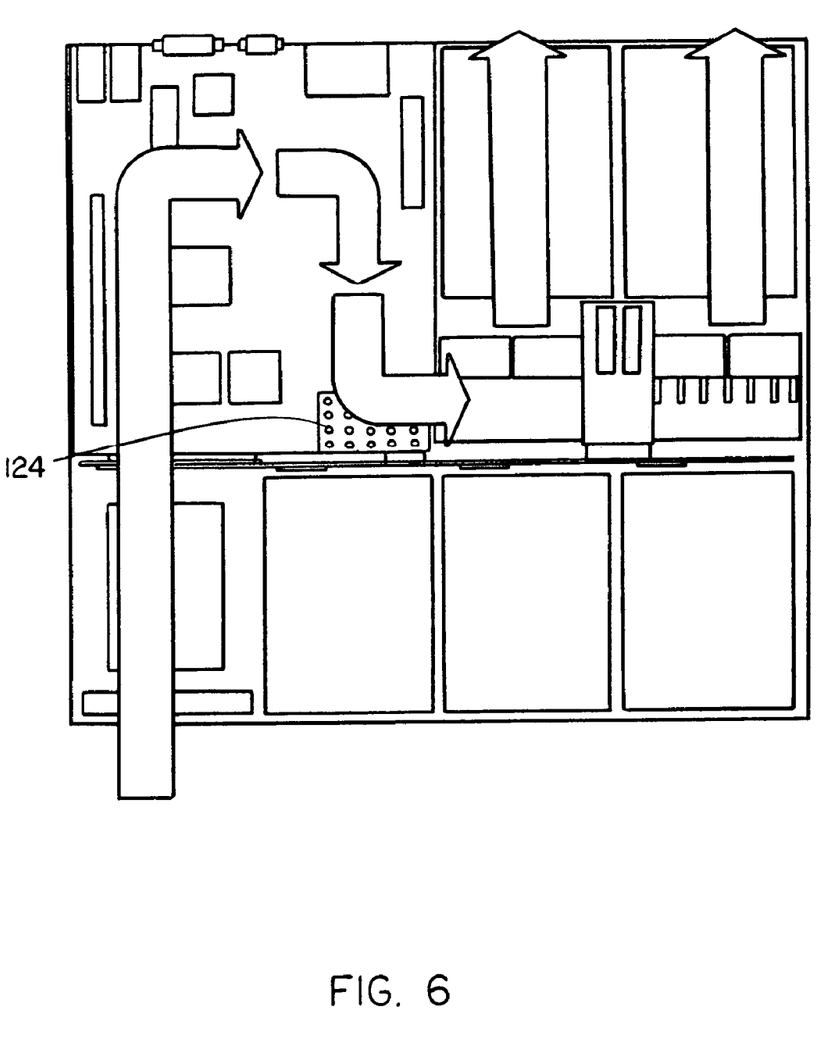
FIG. 6 is a top plan view of an exemplary airflow through a rackmount electronic device chassis including airflow through a sub-housing including a waste heat generating device.
Figure 7:
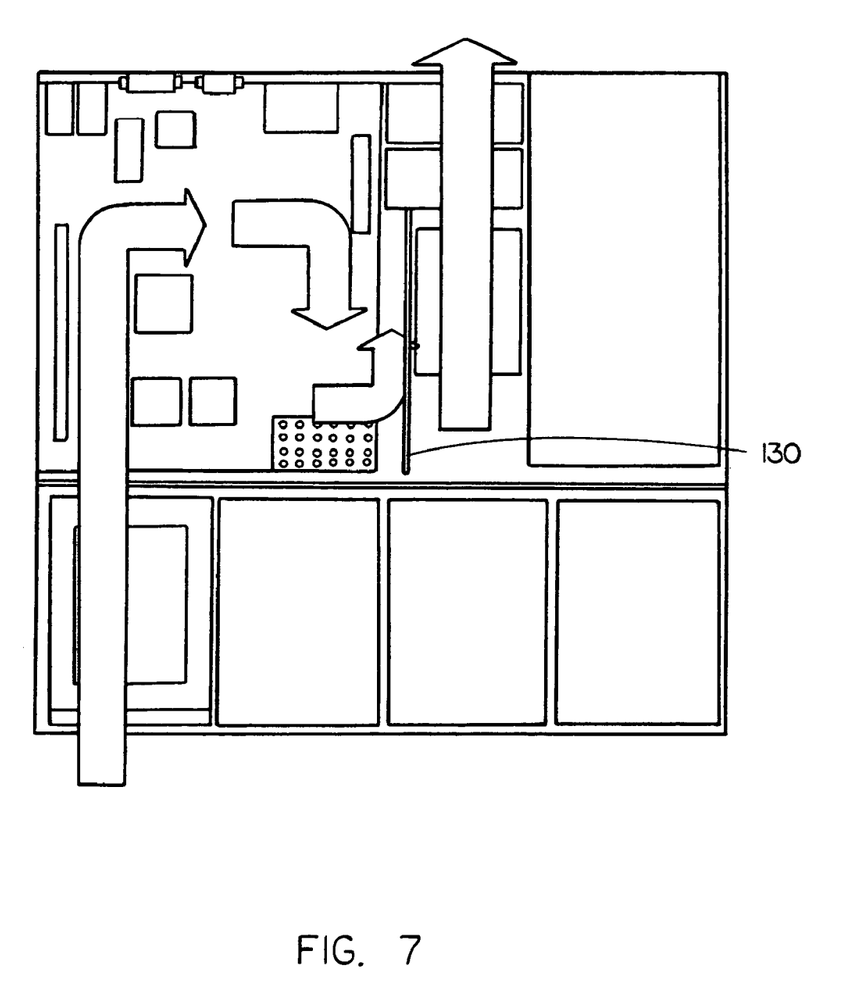
FIG. 7 is a top plan view of an exemplary airflow through a rackmount electronic device chassis the chassis including an internal partition wall for directing airflow.

Referring to FIG. 4B, in a desktop chassis form factor, the airflow through the first airflow exhaust path 122 is blocked by the wall 128 forming the chassis outer enclosure. In this manner, the airflow is directed downwardly or through the second airflow exhaust path 124 into the chamber defined by the chassis 102 and/or functional components contained within the chassis 102. The flow of air 117 may be utilized for subsequent component cooling or exhausted out of the chassis. Airflow directed in a downward direction, in a desktop form factor, may be at least partially directed by a midplane 112 generally bisecting the chassis enclosure. In a further embodiment generally observed in FIGS. 6 and 7, when a rack form factor chassis is implemented, the first component sub-housing's second airflow exhaust path 124 is blocked by the chassis of a second sub-housing disposed adjacent the second airflow path 124. Airflow from the first airflow path 122, of the first component, may be directed into the chassis chamber. Airflow in the chassis may be at least partially directed by an inner partition wall 130 included in the chassis. In a specific example, a second motherboard processor module includes a chassis having a sub-housing with a wall for blocking airflow from a first motherboard module placed in proximity to the second motherboard module. Airflow is thus directed through the other airflow path of the first portion of the data storage system chassis. The variation of airflow paths may permit a single component form factor to be implemented with various chassis form factors while ensuring sufficient cooling for the various components contained within the chassis, thereby ensuring modular utilization for a wide variety of chassis form factors.

Figure 3:
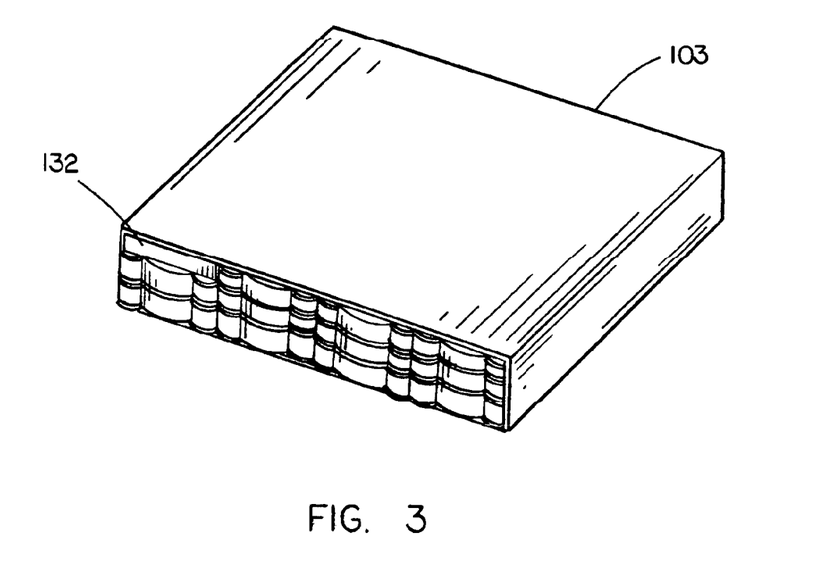
FIG. 3 is an isometric view of a rack data storage device chassis assembly in accordance with the present invention.
Figure 8:
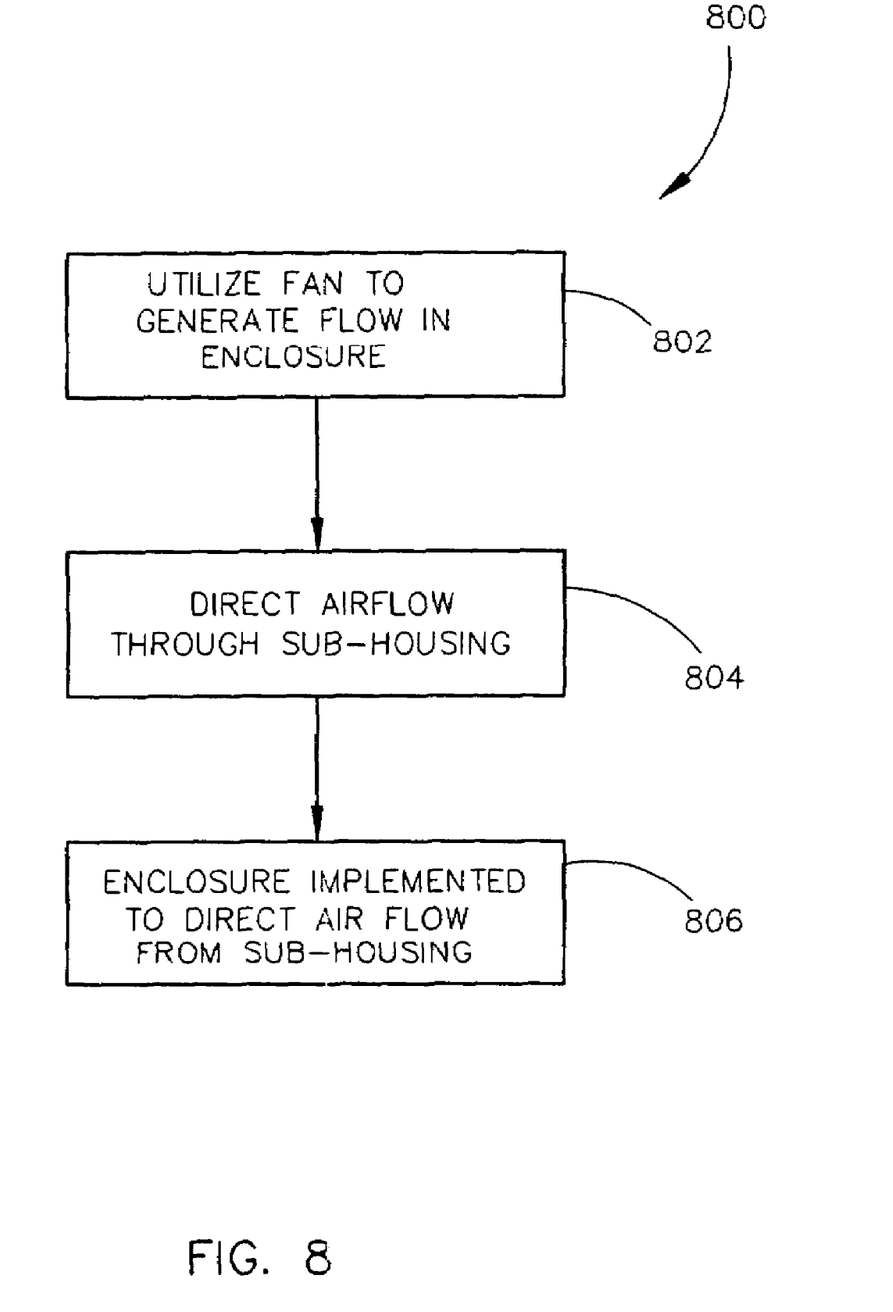
FIG. 8 is a flow chart illustrating an exemplary method of controlling airflow in and electronic device enclosure.

Referring to FIG. 8, a method 800 in accordance with the present invention is disclosed. The method 800 of the present invention may be implemented with a variety of electronic devices individually having structural configurations. The method 800 may be utilized for information handling systems, data storage systems, and the like electronic devices implementing modular components. The method 800 utilizes a fan 802 to generate a flow of air in an electronic device enclosure. In a particular example of the method, the fan is disposed inboard the chassis. Utilizing 802 an inboard fan may minimize the noise/vibration typically associated with similar electronic devices having fans disposed substantially at the periphery of the device enclosure. The generated airflow is directed 804 through a sub-housing containing a waste heat generating device. The airflow from the sub-housing is selectively directed through an exhaust path based on the structural configuration of the electronic device enclosure. For example, the electronic device enclosure is implemented 806 to direct airflow from the sub-housing based on the structural configuration of the device enclosure. The configuration of the device enclosure having a desktop form factor may direct airflow in a downward direction (when observed as orientated in FIG. 1) or the airflow may be directed to a side for an enclosure having a rack form factor as illustrated in FIG. 3. In a further example of the method, the electronic device enclosure is capable of selectively directing airflow exhausted from the sub-housing in one of a first orthogonal direction or a second orthogonal direction. Selective directing may be accomplished based on the inclusion of walls, partitions and the like included in the chassis or by the inclusion of a functional component which is configured to be received in the chassis in order to block the airflow thus permitting airflow to be directed in a different direction.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A data storage device chassis assembly, comprising:
   a chassis for housing a data storage device, the chassis being configured for receiving components, the chassis having a chassis enclosure configuration; and
   at least one component housing for containing a component, the at least one component housing being user configurable to direct an airflow over the component including a waste heat generating device contained within the at least one component housing, the at least one component housing defining a first airflow exhaust path for exhausting airflow from the at least one component housing in a first direction and a second airflow exhaust path for exhausting airflow from the at least one component housing in a second direction, and the airflow is exhausted utilizing one of the first airflow exhaust path or the second airflow exhaust path;

wherein the exhausting of airflow from the at least one component housing is determined by the chassis enclosure configuration and the at least one component housing, and is user configurable.

2. The data storage device chassis assembly of claim 1, wherein the second airflow exhaust path is substantially perpendicular to the first airflow exhaust path.

3. The data storage device chassis assembly of claim 1, wherein the at least one component housing is configured to contain a central processing unit.

4. The data storage device chassis assembly of claim 1, wherein the chassis is at least one of a rack form factor, a desktop form factor, or a desk side tower form factor.

5. The data storage device chassis assembly of claim 1, wherein the chassis includes a wall for selectively blocking one of the first exhaust path or the second exhaust path.

6. The data storage device chassis assembly of claim 1, wherein the at least one component housing is configured to contain at least one of a battery, a data storage device, or a power supply.

7. The data storage device chassis assembly of claim 1, wherein the at least one component housing includes a first component housing and a second component housing, the chassis enclosure configuration being configured to accept the second component housing, within the chassis, the second component housing being disposed to block at least one of the first airflow exhaust path or the second airflow exhaust path of the first component housing.

8. The data storage device chassis assembly of claim 1, wherein the chassis is a desktop form factor, the desktop form factor chassis being constructed to include a wall for blocking at least one of the first airflow exhaust path or the second airflow exhaust path.

9. The data storage device chassis assembly of claim 1, wherein said chassis enclosure configuration causes movement of airflow in said first direction and said second direction.

10. The data storage device chassis assembly of claim 1, wherein said chassis enclosure configuration includes the configuration of exterior walls and partial walls of said chassis.

11. The data storage device chassis assembly of claim 1, wherein said chassis enclosure configuration includes the configuration of structures for securing functional components.

12. The data storage device chassis assembly of claim 1, wherein said chassis includes a plurality of apertures for exhausting airflow.

13. A chassis assembly for an electronic device, comprising:

a chassis for housing the electronic device, the chassis being user configured for receiving functional components, the chassis having a chassis enclosure configuration; and at least one component housing for containing a component, the component housing being user configured to direct an airflow over the component including a waste heat generating device contained within the at least one component housing, the at least one component housing defining a first airflow exhaust path for exhausting airflow from the at least one component housing in a first direction and a second airflow exhaust path for exhausting airflow from the at least one component housing in a second direction, and the airflow is exhausted utilizing one of the first airflow exhaust path or the second airflow exhaust path;

wherein the chassis selectively directs the airflow exhaust through the first airflow exhaust path or the second airflow exhaust path determined by the chassis enclosure configuration and the at least one component housing.

14. The chassis assembly for an electronic device of claim 13, wherein the second airflow exhaust path is substantially perpendicular to the first airflow exhaust path.

15. The chassis assembly for an electronic device of claim 13, wherein the at least one component housing is configured to contain a central processing unit.

16. The chassis assembly for an electronic device of claim 13, wherein the chassis is at least one of a rack form factor, a desktop form factor, or a desk side tower form factor.

17. The chassis assembly for an electronic device of claim 13, wherein the chassis includes a wall for selectively blocking one of the first airflow exhaust path or the second exhaust path.

18. The chassis assembly for an electronic device of claim 13, wherein the wherein the at least one component housing is configured to contain at least one of a battery, a data storage device, or a power supply.

19. The chassis assembly for an electronic device of claim 13, wherein the at least one component housing includes a first component housing and a second component housing, the chassis enclosure configuration being configured to accept the second component housing within the chassis to block at least one of the first exhaust path or the second exhaust path included in the first component housing.

20. The chassis assembly for an electronic device of claim 13, wherein the chassis is a desktop form factor, the desktop form factor chassis being constructed to include a wall for blocking at least one of the first exhaust path or the second exhaust path.

21. The chassis assembly for an electronic device of claim 13, wherein said chassis enclosure configuration causes movement of airflow in said first direction and said second direction.

22. The chassis assembly for an electronic device of claim 13, wherein said chassis enclosure configuration includes the configuration of exterior walls and partial walls of said chassis.

23. The chassis assembly for an electronic device of claim 13, wherein said chassis enclosure configuration includes the configuration of structures for securing functional components.

24. The chassis assembly for an electronic device of claim 13, wherein said chassis includes a plurality of apertures for exhausting airflow.

25. A chassis assembly for an electronic device, comprising:

means for containing components, for providing information handling functionality; and at least one component housing for containing a waste heat generating component, the component housing being user configured to direct an airflow over a waste heat generating device contained within the at least one component housing, the at least one component housing defining a first airflow exhaust path for exhausting airflow from the at least one component housing in a first direction and a second airflow exhaust path for exhausting airflow from the at least one component housing in a second direction, and the airflow is exhausted utilizing one of the first airflow exhaust path or the second airflow exhaust path;

wherein the containing means directs the airflow through one of the first airflow exhaust path or the second airflow exhaust path determined by the arrangement of the at least one component housing within the containing means.

26. The chassis assembly for an electronic device of claim 25, wherein the second airflow exhaust path is substantially perpendicular to the first airflow exhaust path.

27. The chassis assembly for an electronic device of claim 25, wherein the at least one component housing is configured to contain a central processing unit.

28. The chassis assembly for an electronic device of claim 25, wherein containing means is configured as at least one of a rack configuration or a desktop configuration.

29. The chassis assembly for an electronic device of claim 25, wherein the wherein the at least one component housing is configured to contain at least one of a battery, a data storage device, or a power supply.

30. A method of controlling airflow in an electronic device enclosure having a structural configuration, comprising:
    utilizing a fan to generate a flow of air;
    directing the generated flow of air through a component housing containing a waste heat generating device, the component housing disposed in the electronic device enclosure;
    implementing the electronic device enclosure to selectively direct the exhaust path of the generated airflow from the component housing through at least one of a first airflow exhaust or the second airflow exhaust path determined by the structural configuration of the electronic device enclosure, where the structural configuration is user configurable.

31. The method of claim 30, wherein implementing the electronic device enclosure to selectively direct the exhaust path permits the airflow to be exhausted from the component housing in one of a first orthogonal direction or a second orthogonal direction based on the structural configuration of the electronic device enclosure.

32. The method of claim 30, wherein implementing the electronic device enclosure to selectively direct the exhaust path is accomplished by disposing a second different component housing within the electronic device enclosure proximate to the component housing through which the airflow is passed.

33. The method of claim 30, wherein the fan is substantially disposed inboard the electronic device enclosure to minimize fan noise external to the electronic device chassis.

* * * * *